United States Patent
Tu et al.

(10) Patent No.: US 10,678,126 B2
(45) Date of Patent: Jun. 9, 2020

(54) SEMICONDUCTOR MASK BLANKS WITH A COMPATIBLE STOP LAYER

(71) Applicant: Taiwan Semiconductor Manufacturing Company, Ltd., Hsin-Chu (TW)

(72) Inventors: Chih-Chiang Tu, Tauyen (TW); Chun-Lang Chen, Tainan County (TW); Boming Hsu, Tainan (TW); Tran-Hui Shen, Yunlin County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 230 days.

(21) Appl. No.: 15/956,001

(22) Filed: Apr. 18, 2018

(65) Prior Publication Data
US 2018/0240668 A1 Aug. 23, 2018

Related U.S. Application Data

(60) Division of application No. 14/856,670, filed on Sep. 17, 2015, now Pat. No. 9,953,833, which is a continuation of application No. 14/225,649, filed on Mar. 26, 2014, now Pat. No. 9,142,423, which is a division of application No. 13/362,818, filed on Jan. 31, 2012, now Pat. No. 8,715,890.

(51) Int. Cl.
| G03F 1/26 | (2012.01) |
| G03F 1/46 | (2012.01) |
| H01L 21/31 | (2006.01) |
| H01L 21/311 | (2006.01) |
| H01L 21/66 | (2006.01) |
| H01L 21/033 | (2006.01) |

(52) U.S. Cl.
CPC .................. *G03F 1/26* (2013.01); *G03F 1/46* (2013.01); *H01L 21/0332* (2013.01); *H01L 21/0337* (2013.01); *H01L 21/31* (2013.01); *H01L 21/31116* (2013.01); *H01L 22/26* (2013.01)

(58) Field of Classification Search
CPC ..................... G03F 1/26; G03F 1/46
USPC ............................................. 430/5
See application file for complete search history.

(56) References Cited

U.S. PATENT DOCUMENTS

| 5,582,939 A | 12/1996 | Pierrat |
| 5,667,632 A | 9/1997 | Burton et al. |
| 6,051,345 A | 4/2000 | Huang |
| 6,227,528 B1 | 5/2001 | Billings |
| 6,569,580 B2 | 5/2003 | Campi et al. |
| 7,365,005 B1 | 4/2008 | Gadgil |
| 7,846,617 B2 | 12/2010 | Suda |
| 8,043,771 B2 | 10/2011 | Kominato et al. |
| 8,137,868 B2 | 3/2012 | Nozawa |
| 8,715,890 B2 * | 5/2014 | Tu ............... H01L 21/31 430/5 |
| 9,142,423 B2 * | 9/2015 | Tu ............... H01L 21/31 |
| 9,953,833 B2 * | 4/2018 | Tu ............... H01L 21/31 |
| 2002/0028392 A1 | 3/2002 | Jin et al. |
| 2003/0039922 A1 | 2/2003 | Han et al. |
| 2003/0064297 A1 | 4/2003 | Shiota et al. |
| 2003/0226819 A1 | 12/2003 | Tzu et al. |
| 2005/0026053 A1 | 2/2005 | Martin et al. |
| 2006/0051681 A1 | 3/2006 | Taylor |
| 2007/0248892 A1 | 10/2007 | Rangelow |
| 2007/0292769 A1 | 12/2007 | Kobayashi |
| 2009/0253054 A1 | 10/2009 | Kominato et al. |
| 2010/0066969 A1 | 3/2010 | Hwang et al. |
| 2013/0193565 A1 | 8/2013 | Tu et al. |
| 2014/0199787 A1 | 7/2014 | Tu et al. |
| 2016/0013058 A1 | 1/2016 | Tu et al. |

OTHER PUBLICATIONS

Dielectric Constant-Permittivity, Maxwell-equations.com, Jan. 27, 2013, 5 pages.

\* cited by examiner

*Primary Examiner* — Christopher G Young
(74) *Attorney, Agent, or Firm* — Haynes and Boone, LLP

(57) ABSTRACT

A mask for semiconductor manufacturing includes a mask substrate, a shifter layer over the mask substrate, a stop layer over and in contact with the shifter layer, and an absorber layer over the stop layer. The shifter layer includes each material of a set of materials, the materials being combined in a first proportion in the shifter layer. The stop layer includes each material of the set of materials, the materials being combined in a second proportion in the stop layer that is different from the first proportion.

20 Claims, 5 Drawing Sheets

SEMICONDUCTOR MASK BLANKS WITH A COMPATIBLE STOP LAYER

PRIORITY DATA

This is a divisional of U.S. patent application Ser. No. 14/856,670, filed on Sep. 17, 2015, which is a continuation of U.S. patent application Ser. No. 14/225,649, filed on Mar. 26, 2014, now issued U.S. Pat. No. 9,142,423, which is a divisional of U.S. patent application Ser. No. 13/362,818, filed on Jan. 31, 2012, now issued U.S. Pat. No. 8,715,890. The disclosures of the above applications and patents are hereby incorporated by reference in their entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Semiconductor fabrication relies heavily on the process of photolithography, in which light of a given frequency is used to transfer a desired pattern onto a wafer undergoing semiconductor processing. To transfer the pattern onto the wafer, a photomask (also referred to as a mask or reticle) is often used. The photomask permits and prevents light in a desired pattern onto a layer of the wafer, such as a photoresist (PR) layer, which chemically reacts to the light exposure, removing some portions of the PR and leaving other portions. The remaining PR is then used to pattern an underlying layer. As feature sizes have decreased, the wavelength of light used in photolithography to pattern layers has decreased as well, creating additional difficulties and necessitating technological advances such as the use of extreme ultraviolet (EUV) as a light source and also phase-shifting masks. Improving photomasks is important to the continued advances in the industry, because various kinds of imperfections or problems in the resulting patterned layer can be compounded during subsequent processing steps as semiconductor device or integrated circuit is made. Photomask improvements include improvements made to the mask blank on which the photomask is derived and patterning the photomask.

For example, during phase-shifting mask fabrication, defects such as thin semi-transparent residue can be formed which often need localized etching to repair. The localized etching process can result in damage to an underlying mask substrate because a proper end point of the etch may be difficult to detect. Therefore, while some current techniques for creating photomasks have been adequate, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIG. 1 is a flowchart depicting a method for creating an improved semiconductor mask blank with an etch stop layer that is optically compatible with the other layers.

FIGS. 2A-B depict two diagrammatic fragmentary cross-sectional side views of two semiconductor mask blanks which incorporate an optically compatible and process compatible etch stop layer.

FIG. 3 is a flowchart depicting a method for patterning an improved semiconductor mask with an optically compatible and process compatible etch stop layer.

FIGS. 4A-F depict a series of diagrammatic fragmentary cross-sectional side views of a portion of a phase-shifting semiconductor mask blank in a process for patterning the mask for use in semiconductor device fabrication.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity. Various ranges presented may be understood as approximations given the natural variations experiences in semiconductor manufacturing processes.

FIG. 1 illustrates a method 100 used for manufacturing a mask blank for a photomask according to various aspects of the present disclosure. The method 100 begins with step 102 by receiving a mask blank substrate in a mask processing system. The system may include many different tools or machines, and be capable of many different kinds of processes, such as chemo-mechanical planarization (CMP), material deposition, material removal, and physical characterization. The blank mask substrate may be of a variety of suitable materials, including quartz, glass, low thermal expansion materials (LTEMs), and other materials that may be apparent to those skilled in the art.

After the mask blank substrate has been received, the method 100 continues in step 104 with the deposition of a process-compatible and optically-compatible stop layer over the substrate. The stop layer is described as process-compatible as it may be made of substantially similar materials and by substantially similar processes as one or more other layers that may be included on the mask substrate in method 100. Further, the stop layer is described as being optically compatible as it may be made of materials such that the optical characteristics of the layer, e.g. reflectivity, dielectric constant, and index of refraction, are similar to those of one or more other layers deposited on the mask substrate in method 100. Various embodiments of these layers will be discussed below.

In step 106, a shifter layer is deposited over the blank substrate. In certain embodiments, the shifter layer may comprise a single effective layer comprising molybdenum, silicon, and a nitride such as oxynitride. The shifter layer may serve as a phase-shifting layer, such as may be found in a phase-shifting mask (PSM). Alternatively, the shifter layer may comprise alternating layers of molybdenum and silicon such as are used as the multilayer (ML) portion of a semiconductor mask for use in an extreme ultraviolet (EUV) lithography process. That is, in some embodiments, the shifter layer is situated in between the stop layer and the substrate. In other embodiments the stop layer is situated in between the shifter layer and the substrate.

In step 108, a metal hard mask layer is deposited over the shifter layer. Materials for the metal hard mask layer may include chromium, chromium oxide, chromium nitride, silicon nitride, silicon oxynitride, tantalum oxide, tantalum nitride, tantalum oxynitride, or other material suitable to reflect or absorb light as required by the process for which the mask being formed is intended. The metal hard mask layer may typically be deposited over the stop and shifter layers. The layers deposited in various steps of method 100 may be deposited by many different processes. For example, the layers may be deposited by sputtering, physical vapor deposition, chemical vapor deposition, and/or other suitable deposition techniques as may be known in the art.

Figure 1:
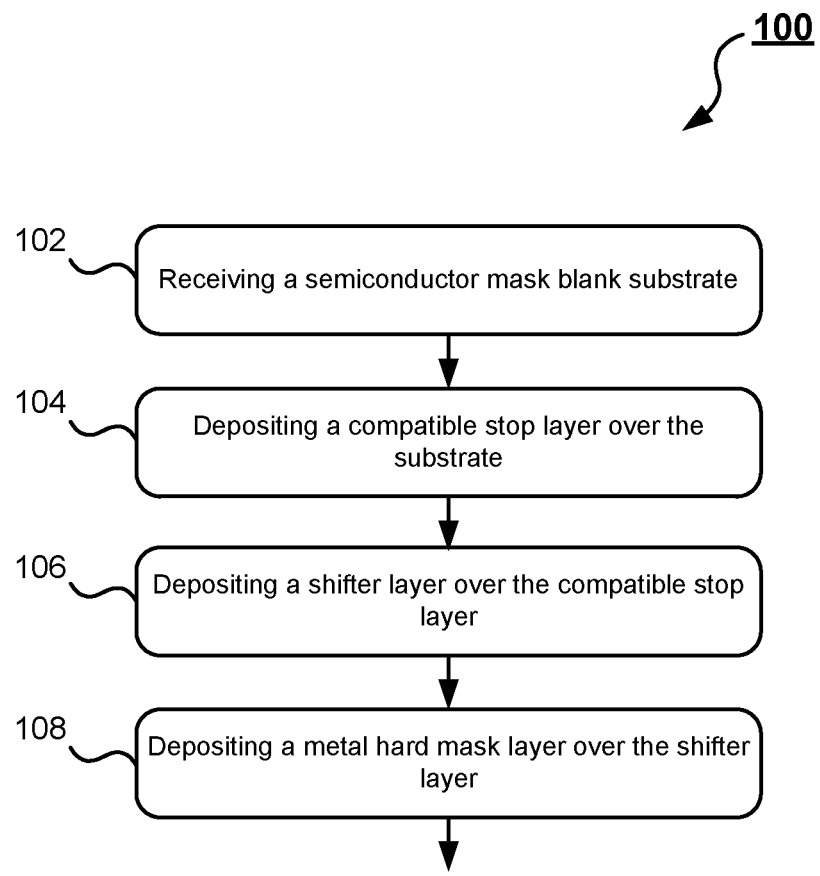
Figure 2A:
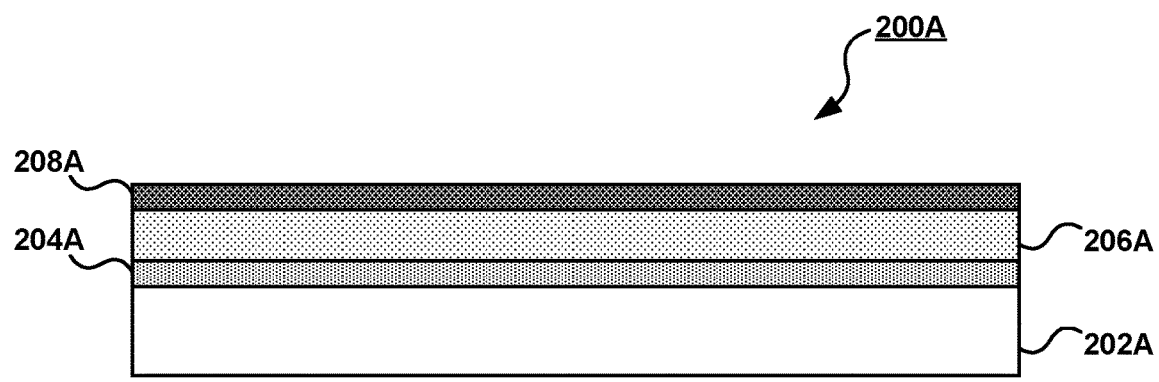
Figure 2B:
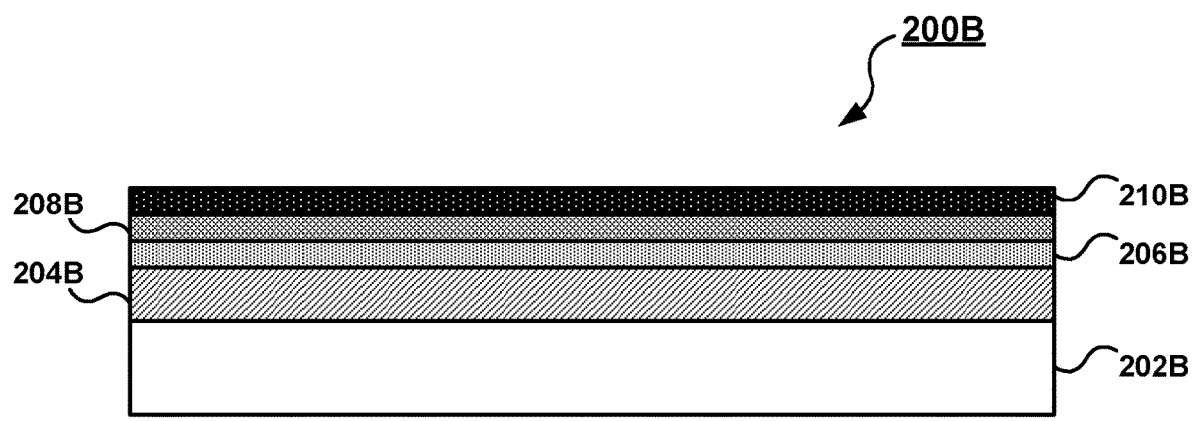

FIGS. 2A and 2B depict diagrammatic fragmentary cross-sectional side views of some embodiments of mask blanks as fabricated according to method 100. FIG. 2A depicts a stack of materials suitable for a phase-shifting mask blank 200A. PSM blank 200A includes a quartz substrate 202A, a stop layer 204A, a shifter layer 206A, and a hard metal mask layer 208A. Each layer may underlie the next as listed. In at least one embodiment, the stop layer 204A may comprise molybdenum, silicon, and oxynitride in a certain proportion, while shifter layer 206A comprises molybdenum, silicon, and oxynitride in a different proportion. In one embodiment, the stop layer 204A includes about 1 to 2% molybdenum, 50 to 55% silicon, and 40 to 50% oxynitride by weight; the shifter layer 206A includes about 4 to 5% molybdenum, 45 to 50% silicon, and 40 to 50% oxynitride by weight. The stop layer 204A is 20 to 50 Å thick, while the shifter layer 206A is 600 to 700 Å thick. Given such layer compositions, the stop layer 204A and the shifter layer 206A may be produced in the same process step or tool by using an appropriate recipe to control the composition as desired. The metal hard mask layer 208A may be deposited over layers 204A and 206A and may be made of chromium or a chromium oxide suitable for the requirements of PSM blank 200A. Hard metal mask layer may be from 400 to 600 Å thick.

In another embodiment, the stop layer and shifter layer are selected with reference to optical properties. For example, the stop layer has a reflectivity of less than 15%, an index of refraction between 2.2 and 2.4 and a dielectric constant of 0.55 to 0.6; and the shifter layer 206A may have a reflectively of less than 15%, an index of refraction of 2.5 to 2.6, and a dielectric constant from 0.6 to 0.65. Such range values as listed above should not be construed narrowly, but are approximations of potential embodiments of the invention due to inevitable process variations. The optical properties of the layers in a mask blank are important since they affect the physical qualities of all layers patterned using the masks made from the blanks. Thus, the stop layer 204A and the shifter layer 206A have compatible optical characteristics to limit potential optical problems. While not depicted in FIG. 2A, the phase-shifting mask blank 200A may also comprise a layer of a typical, chemically-amplified resist, e.g. photoresist (PR), about 1500 to 2500 Å thick.

FIG. 2B depicts a stack of materials forming an EUV mask blank 200B. As its base, the EUV mask blank 200B may have a low thermal expansion material (LTEM) for a substrate 202B. A shifter layer 204B may be a plurality of material layers, alternating between primarily molybdenum layers and primarily silicon layers. This arrangement is often referred to as a multilayer (ML) stack. So as depicted in FIG. 2B, the shifter layer 204B is a multilayer stack in some embodiments. On top of the shifter layer 204B, there may be a stop layer 206B. The stop layer 206B may be made from a combination of molybdenum, silicon, and oxynitride. In some EUV mask blanks, ruthenium is used as a capping layer on top of the ML stack. In some embodiments of the invention, the stop layer 206B replaces the ruthenium capping layer. This may allow for an EUV mask with lower reflectivity loss during EUV lithography. The stop layer 206B may serve as an effective etch stop for a process, such as anti-chloride plasma etching, that is normally used to etch an overlying absorber layer. Additionally, the stop layer 206B may be made in the same process as the ML stack of the shifter layer 204B. Thus, there may be significant advantages to replacing the ruthenium capping layer with the stop layer 206B made from molybdenum, silicon, and oxynitride. The EUV mask blank 200B may further include an absorber layer 208B, which may be a TaN, silicon nitride, chromium nitride, or other material layer suitable to function as an absorber layer. Above the absorber layer 208B, the EUV mask blank 200B may include an anti-reflective coating (ARC) layer 210B. The ARC layer 210B may be made of TaON or other suitable material.

Figure 3:
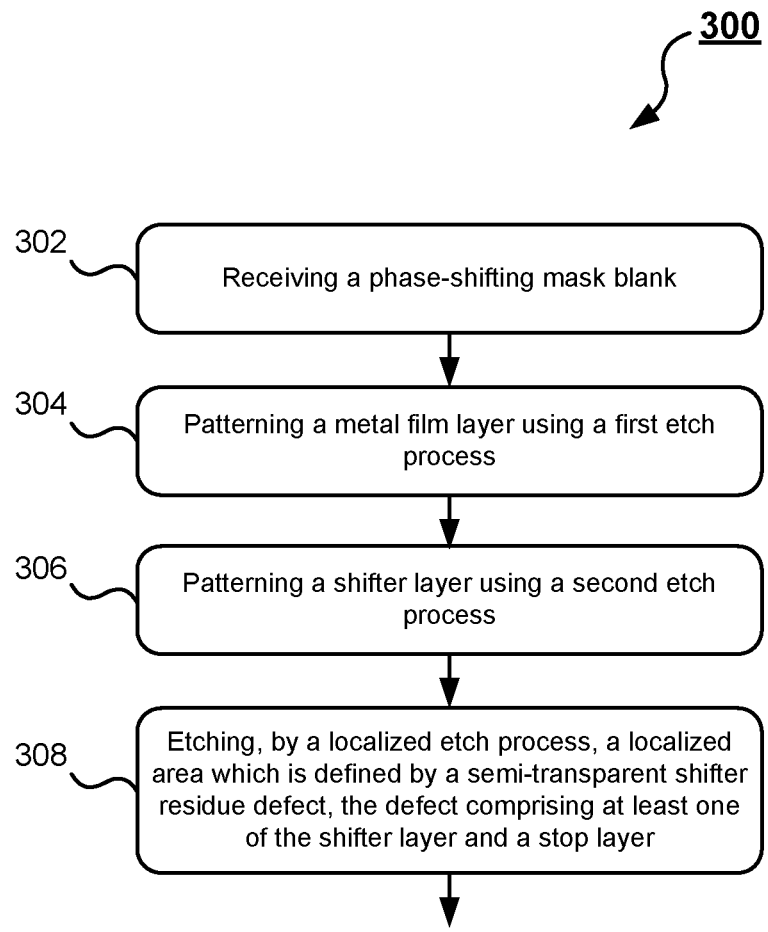

FIG. 3 illustrates a method 300 for patterning a mask blank, such as a phase-shifting mask (PSM) blank 200A discussed above with reference to FIG. 2A. In step 302, the method 300 begins by receiving a PSM blank into a mask patterning system, which may include one or more tools used for patterning PSM blanks into phase-shifting masks. In step 304, a metal film layer of the mask blank is patterned, such as by using a first etch process. When a mask blank is patterned, the blank may first receive a photoresist (PR) coat or layer. Alternatively, if the blank is received with a layer of PR already on it, it may be unnecessary to apply PR at this point in method 300. The layer of PR on top of the metal film layer may be patterned by an electron beam (e-beam) process or other suitable patterning process. After the PR has been patterned, exposed portions of the metal film layer may be removed. This may be done using an anisotropic dry etch such as a plasma etch or other appropriate etch.

In step 306, the shifter layer is patterned using a second etching process. By way of example, in step 306 a shifter layer of molybdenum, silicon, and oxynitride is patterned using a dry etch with $SF_6$ and $O_2$. In some embodiments, the shifter layer is patterned using a gas-assisted etch in step 306. The metal film layer may serve as the etch mask. During steps 304 and 306, problems may occur such as a particle dropping onto the mask or other similar problem. These may result in a semi-transparent residue of the shifter layer material being left behind after the etch designed to remove the shifter layer material from desired locations is mostly complete elsewhere on the mask. These residue defects are often hard to detect, but may still cause undesired effects on semiconductor devices fabricated using the resulting phase-shifting mask. Thus the removal of such defects is important to producing a high-quality mask. While the etch rate of the stop layer may be lower than the etch rate of the shifter layer in this process, some or all of a thickness of stop layer in a given location may be removed by the etching process in step 306.

In step 308 one or more residue defects left behind after steps 304 and 306 may be removed. In some embodiments, the residue comprises only stop layer material, while in other embodiments it comprises stop layer and shifter layer material. The residue is removed from a small, localized area by a localized process, such as gas-assisted etching using an e-beam or focused ion beam tool. The gas used in this etching process may be $XeF_2$. This process allows material to be removed from the small area of the residue, while avoiding damage to the exposed substrate in surrounding areas. The stop layer is etched by the localized process at a slower rate than the shifter layer. This may help prevent etching through and causing damage to the underlying surface by exposure to the gas-assisted etching.

Additionally, in some embodiments of the invention, a residual gas analyzer (RGA) is used in conjunction with the gas-assisted etching tool. The residual gas analyzer is able to detect faint chemical signals originating at the site of localized etching. In the absence of the stop layer as disclosed herein, determining when to stop the localized etch process intended to remove a residue defect may pose particular problems. These problems may be alleviated or eliminated by the use of the stop layer as disclosed. For example, even using a residual gas analyzer on a phase-shifting mask, without the stop layer, to remove defects can not ensure a proper etch stop point, because as the amount of residue decreases, the signal detected by the residual gas analyzer may become too small to be used reliably. Thus the process of locally etching residue defects, without the stop layer, may depend heavily on a trial-and-error process and on operator experience. Monitoring the process may require repeated removal of the mask from the machine for visual inspection using various forms of microscopy, risking contamination of the mask in handling and delaying production time in effort to avoid damaging and then scrapping the mask.

With the stop layer present, the process may be improved. For example, using the RGA to detect important points in the etching process may be more reliable with the stop layer present. In some embodiments of the invention the stop layer is composed of about 1-2% molybdenum, 50-55% silicon, and 40-50% oxynitride by weight, and the shifter layer is composed of about 4-5% molybdenum, 45-50% silicon, and 40-50% oxynitride by weight. The RGA detects useful chemical signals from such a combination, when it could not from the shifter layer alone. First, the RGA may detect the transition from shifter layer material to stop layer material as it is being removed from the localized area of the residue defect. This may provide a clear indication of the amount of material that remains to be removed in order to remove the entire residue defect. Second, the RGA may more easily detect a chemical signal that indicates that the stop layer material has been removed. Thus, embodiments of the invention may provide clearer chemical signals indicating the removal of the shifter layer and the removal of the stop layer. Using these clearer chemical signals, the process of removing residue defects may be simplified and systematized in a way that does not depend so heavily on operator experience or a trial-and-error approach.

For example, while undergoing the localized etch process to remove an identified residue defect, a user of the method and masks as disclosed herein detects a first chemical signal which indicates that the localized etch process has successfully removed the shifter layer material from the localized area and that stop layer material is now being etched. A time later, a second chemical signal indicates that the stop layer material of the residue defect has been removed from the localized area and that the etch process is complete. The first chemical signal may be associated with the compositional differences between the shifter and stop layers. The second chemical signal may be associated with the exhaustion of stop layer material from the location, and thus related to the presence or absence of the stop layer material. Step 308 of method 300 ends when the stop layer material of the defect is removed and that removal is detected.

FIGS. 4A-F illustrates a series of diagrammatic fragmentary cross-sectional side views of a portion of a phase-shifting mask (PSM) blank 400 in a process for patterning a mask for use in semiconductor device fabrication. FIGS. 4A-F depict a portion of the PSM blank 400 at various mask fabrication stages according to embodiments of the present disclosure.

Figure 4A:
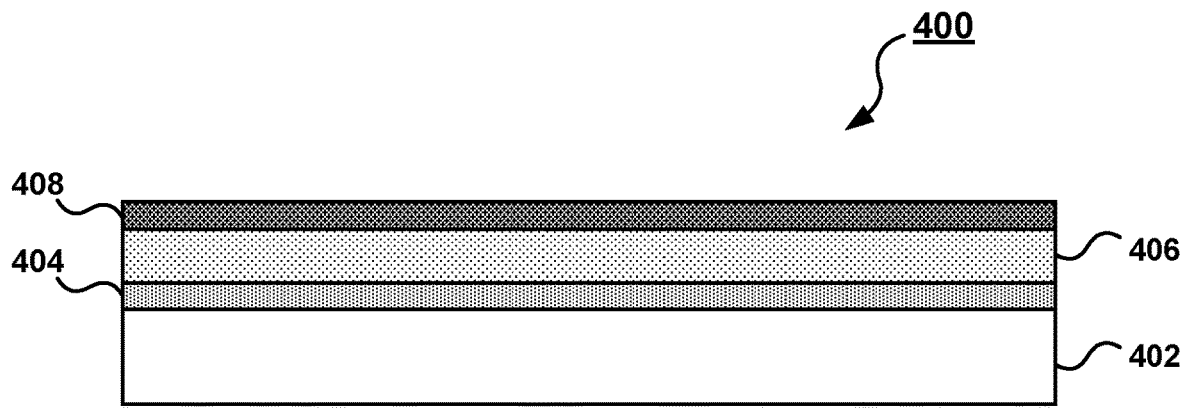

FIG. 4A depicts the PSM blank 400 before any processing steps have been undertaken. The PSM blank 400 includes a substrate 402, a stop layer 404, a shifter layer 406, and a metal hard mask 408. These layers may be comprised of various materials as indicated elsewhere in this application. In at least one embodiment the layers of FIG. 4A are the same as those of FIG. 2A, and this embodiment will be used to provide illustrative detail to FIGS. 4A-F. Thus, the substrate 402 is a quartz substrate, the stop layer 404 comprises molybdenum, silicon, and oxynitride combined in a first proportion, the shifter layer 406 comprises molybdenum, silicon, and oxynitride combined in a second proportion different from the first, and the metal hard mask 408 is chromium.

Figure 4B:
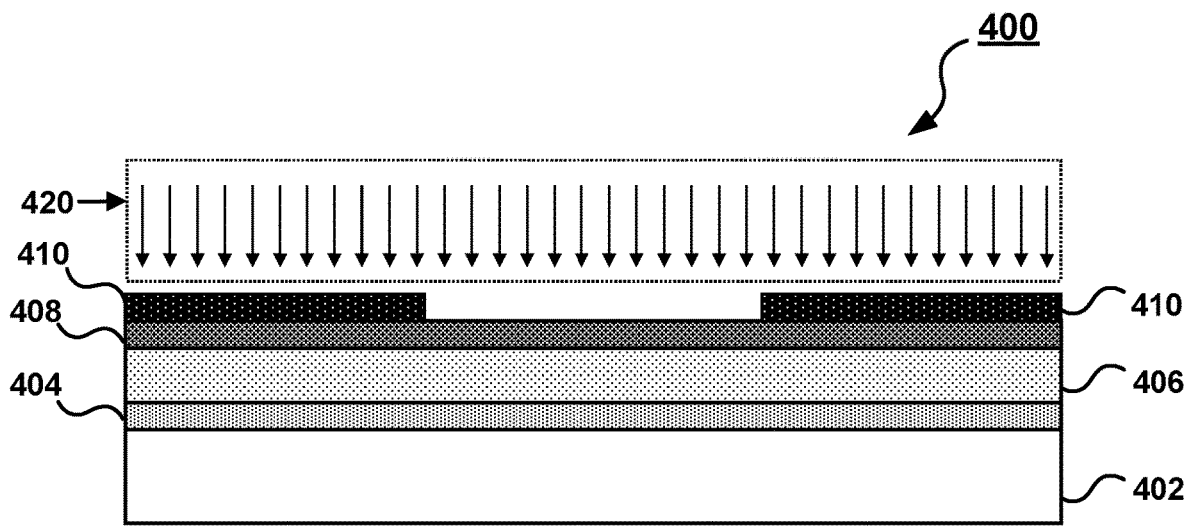

FIG. 4B depicts the PSM blank 400 with a patterned PR layer 410 over it. The patterned PR layer 410 has been deposited earlier and patterned by e-beam lithography before being developed as a masking layer for patterning the metal hard mask 408. The geometry of the patterned PR layer 410 is designed to create an intended opening which will expose the substrate 402. PSM blank 400 is exposed to a first etch process 420 suitable for removing the exposed chromium metal hard mask 408.

Figure 4C:
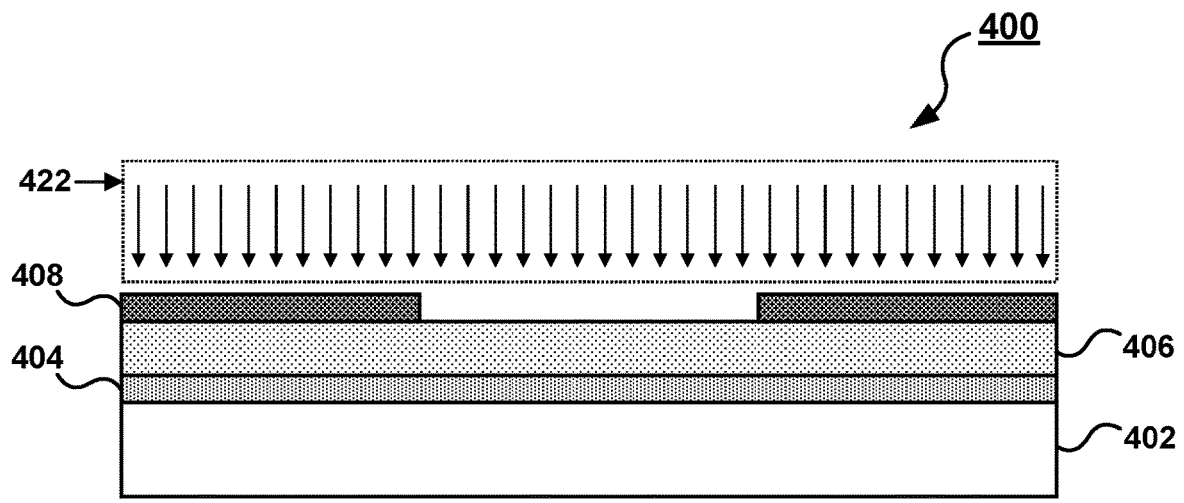

The result of the first etch process 420 is depicted in FIG. 4C. The portion of the metal hard mask 408 that was exposed has been removed. While, not otherwise depicted, the patterned PR layer 410 has also been removed from the rest of the metal hard mask 408. The PSM blank 400 as depicted in FIG. 4C is then subjected to a second etch process 422.

Figure 4D:
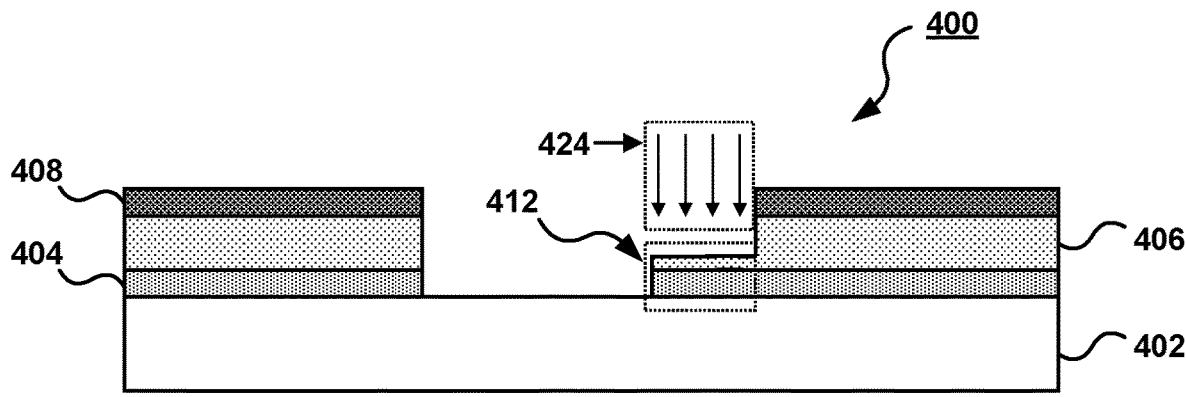

The result of the second etch process 422 is depicted in FIG. 4D. While not always the case, FIG. 4D depicts the second etch process 422 as having resulted in a residue defect 412. As shown in FIG. 4D, the residue defect 412 includes portions of the shifter layer 406 and the stop layer 404. In some other embodiments, residue defect 412 only includes portions of the stop layer 404. After an inspection process indicates the presence and location of the residue defect 412, a first localized etch process 424 is applied to an area limited to the residue defect 412 or a portion thereof.

Figure 4E:
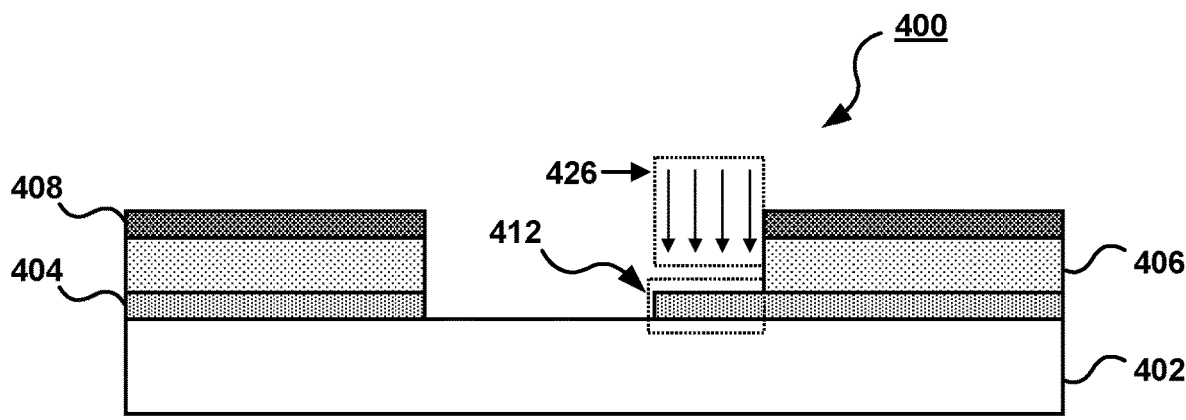

The result of the first localized etching process 424 may be depicted in FIG. 4E. The portion of the shifter layer 406 that formed part of the residue defect 412 has been removed. This may result in a first chemical signal being detected by an RGA in communication with the etching chamber. The residue defect 412 is subjected to a second localized etch process 426. In at least one embodiment, second localized etch process 426 is a mere continuation of the first localized etch process 424 and not a discrete, separate etch process.

Figure 4F:
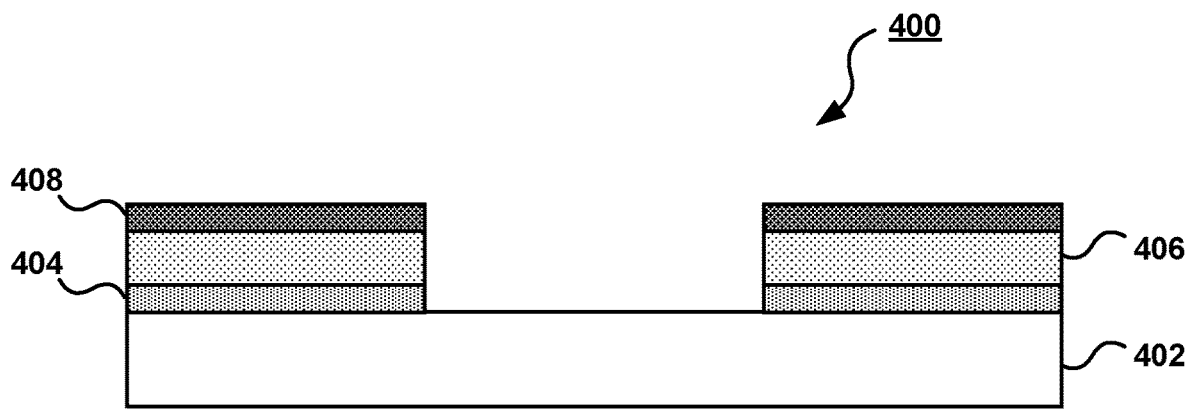

The result of the second localized etch process 426 is depicted in FIG. 4F. The stop layer 402 portion of the residue defect 412 has been removed, thus the entire residue defect 412 has been removed from the localized area, and the intended opening determined by the geometry of the patterned PR layer 410 (as seen in FIG. 4B) has been accurately formed. As the last small amounts of the stop layer 404 portion of residue defect 412 are removed, a second chemical signal may be detected by the RGA. This second chemical signal indicates that the desired result of the second etch process 422 has been achieved, and that the second localized etch process 426 should be stopped to avoid damage to the portion of the substrate 402 exposed by the removal of the residue defect 412.

Throughout FIGS. 4A-F, it should be apparent to those skilled in the art that some additional steps may occur. For example, some developing, stripping, cleaning, and exposure steps have not been portrayed or explained. This has been done to simplify the disclosure and clarify various embodiments of the invention. It should be understood that such processes occur where necessary or advantageous.

The embodiments discussed above offer advantages over conventional phase-shifting and EUV masks. The use of the stop layer as described and envisioned by this disclosure provides a mechanism for recognizing important points in the process of removing residue defects. By recognizing those important points in a consistent manner, and not relying on operator experience, damage to the underlying mask can be avoided. Further the stop layer may provide for a material that is optically compatible with an EUV mask and a phase-shifting mask and is also compatible with the fabrication processes and materials used to create other aspects of EUV and phase-shifting masks, such as the ML stack and the phase shifter respectively. Thus the beneficial stop layer may not require more process steps or tools than currently used and may necessitate fewer. For example, the stop layer as used in the EUV mask replaces the ruthenium layer and its associated processing steps.

One embodiment of the invention is a method for creating a phase-shifting semiconductor mask blank. The method comprises steps of receiving a cleaned and polished mask substrate, depositing a stop layer over the mask substrate, depositing a shifter layer over the stop layer, and depositing a metal hard mask layer over the shifter layer. In at least some embodiments depositing the stop layer and the shifter layer is performed in a single process. In a particular embodiment, the stop layer comprises molybdenum, silicon, and oxynitride in a first proportion; and the shifter layer comprises molybdenum, silicon, and oxynitride in a second proportion. The first proportion of molybdenum, silicon, and oxynitride are not equal to the second proportion.

In other embodiments, the shifter layer is comprised of a material having a reflectivity less than 15%, an index of refraction ranging from 2.2 to 2.4, and a dielectric constant ranging from 0.55 to 0.6; and the stop layer is comprised of a material having a reflectivity less than 15%, an index of refraction ranging from 2.5 to 2.6, and a dielectric constant ranging from 0.6 to 0.65.

Another embodiment of the invention includes a method for removing residue defects from a phase-shifting semiconductor mask blank in a process to create a phase-shifting mask. The method may comprise steps of receiving a PSM blank, etching a metal film layer of the PSM blank, and etching an exposed portion of a shifter layer of the PSM blank. The method further includes etching a localized area of the exposed portion to remove a residue defect. The residue defect comprises a portion of the shifter layer and a portion of a stop layer underlying the shifter layer. In certain embodiments, etching the localized area of the exposed portion of the shifter layer to remove the residue defect is performed using a localized etching process such as, but not necessarily limited to, gas-assisted etching with an e-beam or focused ion beam tool.

In yet another embodiment, the method includes detecting a first chemical signal, which indicates the removal of the shifter layer portion of the residue defect from the localized area. The method further includes detecting a second chemical signal, which indicates the stop layer portion of the residue defect has been removed from the localized area. The method comprises using at least the first chemical signal to determine when to stop the localized etching process. The method also comprises using the second signal to determine when to stop the associated etch. The stop layer comprises molybdenum, silicon, and oxynitride combined in a first proportion, and the shifter layer comprises molybdenum, silicon, and oxynitride combined in a second proportion.

Another embodiment of the invention is a mask blank. The blank comprises a transparent substrate, a stop layer over the substrate formed from a set of materials combined in a first proportion, a shifter layer over the substrate formed from the set of materials combined in a second proportion, and an absorber layer. The first proportion of the set of materials causes the stop layer to have a first etch rate, while the second proportion of the set of materials causes the shifter layer to have a second etch rate, the second etch rate being higher than the first etch rate. The set of materials comprises silicon, molybdenum, and oxynitride. The stop layer and the shifter layer are made by the same deposition process.

In a given embodiment, the first proportion comprises molybdenum in a range from 4 to 5 percent, silicon in a range from 45 to 50 percent, and oxynitride in a range from 40 to 50 percent; and the second proportion comprises molybdenum in a range from 1 to 2 percent, silicon in a range from 50 to 55 percent, and oxynitride in a range from 40 to 50 percent. The first proportion causes the stop layer, when undergoing an etching process, to be more detectable by a residual gas analyzer than the shifter layer, when also undergoing the etching process. Additionally, the reflectivity of the stop layer is approximately equal to the reflectivity of the shifter layer.

In another embodiment, the disclosed features of the invention are adapted to an opaque MoSi on glass (OMOG) mask.

In a particular embodiment of the invention, a mask blank comprises a substrate, a shifter layer which includes a plurality of molybdenum and silicon multilayer structures, a stop layer which is situated over the plurality of multilayer structures, and is comprised of materials including molybdenum and silicon. The substrate is an LTEM substrate, and the absorber layer is an EUV absorber layer; further comprising an anti-reflective coating over the EUV absorber layer. In such an embodiment, the stop layer comprises molybdenum in a range from 1 to 2 percent; silicon in a range from 50 to 55 percent; and oxynitride in a range from 40 to 50 percent.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A mask for semiconductor manufacturing, the mask comprising:
   a mask substrate;

a shifter layer over the mask substrate, the shifter layer including each material of a set of materials, the materials being combined in a first proportion in the shifter layer;

a stop layer over and in contact with the shifter layer, the stop layer including each material of the set of materials, the materials being combined in a second proportion in the stop layer that is different from the first proportion; and an absorber layer over the stop layer.

2. The mask of claim 1, wherein the set of materials comprises molybdenum, silicon, and oxynitride.

3. The mask of claim 2, wherein:
the first proportion comprises:
molybdenum in a range from about 4 to 5 percent,
silicon in a range from about 45 to 50 percent, and
oxynitride in a range from about 40 to 50 percent; and
the second proportion comprises:
molybdenum in a range from about 1 to 2 percent,
silicon in a range from about 50 to 55 percent, and
oxynitride in a range from about 40 to 50 percent.

4. The mask of claim 1, wherein the absorber layer includes one of tantalum nitride, silicon nitride, and chromium nitride.

5. The mask of claim 1, further comprising an anti-reflective coating (ARC) layer formed over the absorber layer.

6. The mask of claim 1, wherein at least the absorber layer includes patterns for making manufacturing integrated circuits.

7. The mask of claim 1, wherein the mask substrate includes a low thermal expansion material.

8. The mask of claim 1, wherein the shifter layer includes multiple layers alternating between primarily molybdenum layers and primarily silicon layers.

9. A mask for semiconductor manufacturing, the mask comprising:
a mask substrate;
a shifter layer over the mask substrate;
a stop layer over and in contact with the shifter layer, the stop layer including molybdenum, silicon, and oxynitride; and
an absorber layer over the stop layer.

10. The mask of claim 9, wherein the stop layer comprises:
molybdenum in a range from about 1 to 2 percent,
silicon in a range from about 50 to 55 percent, and
oxynitride in a range from about 40 to 50 percent.

11. The mask of claim 9, wherein the shifter layer comprises molybdenum, silicon, and oxynitride in a composition different from that of the stop layer.

12. The mask of claim 11, wherein the shifter layer comprises:
molybdenum in a range from about 4 to 5 percent,
silicon in a range from about 45 to 50 percent, and
oxynitride in a range from about 40 to 50 percent.

13. The mask of claim 9, wherein the shifter layer comprises alternating layers of primarily molybdenum and layers of primarily silicon.

14. The mask of claim 9, wherein the mask substrate includes a low thermal expansion material.

15. The mask of claim 9, wherein at least the absorber layer is patterned.

16. The mask of claim 9, wherein the absorber layer includes tantalum nitride, silicon nitride, or chromium nitride.

17. The mask of claim 9, further comprising an anti-reflective coating (ARC) layer over the absorber layer.

18. A mask for semiconductor manufacturing, the mask comprising:
a low thermal expansion material (LTEM) substrate;
a shifter layer over the LTEM substrate, wherein the shifter layer includes alternating layers of primarily molybdenum and layers of primarily silicon;
a stop layer over and in contact with the shifter layer, the stop layer including molybdenum, silicon, and oxynitride; and
an absorber layer over the stop layer, wherein the absorber layer includes tantalum nitride, silicon nitride, or chromium nitride.

19. The mask of claim 18, wherein the stop layer comprises:
molybdenum in a range from about 1 to 2 percent,
silicon in a range from about 50 to 55 percent, and
oxynitride in a range from about 40 to 50 percent.

20. The mask of claim 18, further comprising an anti-reflective coating (ARC) layer over the absorber layer.

* * * * *